United States Patent
Iwahara et al.

(10) Patent No.: US 7,139,154 B2
(45) Date of Patent: Nov. 21, 2006

(54) DISC DRIVE ACTUATOR ASSEMBLY WITH TRUNK FLEXIBLE PRINTED CIRCUIT BOARD DAMPING CONFIGURATION

(75) Inventors: Hiroyuki Iwahara, Kawasaki (JP); Mitsuhiro Izumi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 74 days.

(21) Appl. No.: 10/606,844

(22) Filed: Jun. 27, 2003

(65) Prior Publication Data

US 2004/0264057 A1 Dec. 30, 2004

(51) Int. Cl.
G11B 5/48 (2006.01)
G11B 5/55 (2006.01)
G11B 21/16 (2006.01)
G11B 21/21 (2006.01)
G11B 33/14 (2006.01)

(52) U.S. Cl. .............................. 360/245.9; 360/97.02; 360/264.2; 360/266.3

(58) Field of Classification Search ............ 360/245.9, 360/244.3, 97.02, 266.3, 244.1, 245.8, 246, 360/264.2
See application file for complete search history.

(56) References Cited

U.S. PATENT DOCUMENTS

| | | | | |
|---|---|---|---|---|
| 4,819,094 A | * | 4/1989 | Oberg ..................... | 360/245.9 |
| 5,095,396 A | * | 3/1992 | Putnam et al. ........... | 360/264.2 |
| 5,781,380 A | * | 7/1998 | Berding et al. .......... | 360/264.2 |
| 5,818,667 A | * | 10/1998 | Larson .................... | 360/264.2 |
| 5,825,590 A | * | 10/1998 | Ohwe ..................... | 360/244.8 |
| 6,057,981 A | * | 5/2000 | Fish et al. ................ | 360/264.2 |
| 6,163,443 A | * | 12/2000 | Hatagami et al. ........ | 360/264.2 |
| 6,282,062 B1 | * | 8/2001 | Shiraishi .................. | 360/244.3 |
| 6,310,746 B1 | * | 10/2001 | Hawwa et al. ........... | 360/244.2 |
| 6,349,009 B1 | * | 2/2002 | Dakroub et al. ......... | 360/245.9 |
| 6,353,515 B1 | * | 3/2002 | Heim ...................... | 360/245.9 |
| 6,366,432 B1 | * | 4/2002 | Tadepalli et al. ........ | 360/264.2 |
| 6,515,832 B1 | * | 2/2003 | Girard ..................... | 360/245.8 |
| 6,704,157 B1 | * | 3/2004 | Himes et al. ................. | 360/75 |
| 6,728,073 B1 | * | 4/2004 | Budde et al. ............ | 360/245.9 |
| 2003/0011936 A1 | * | 1/2003 | Himes et al. ............ | 360/245.3 |
| 2003/0086214 A1 | * | 5/2003 | Shin ........................ | 360/266.3 |
| 2005/0135016 A1 | * | 6/2005 | Ohwe ...................... | 360/245.9 |

FOREIGN PATENT DOCUMENTS

| | | | | |
|---|---|---|---|---|
| GB | 2193833 | A | * | 2/1988 |
| JP | 10134529 | A | * | 5/1998 |
| JP | 11134627 | A | * | 5/1999 |

OTHER PUBLICATIONS

Translation of Japanese Publication No. 11-134627 published May 21, 1999 to Masakazu Inaba.*

* cited by examiner

Primary Examiner—Craig A. Renner
(74) Attorney, Agent, or Firm—Westerman, Hattori, Daniels & Adrian, LLP.

(57) ABSTRACT

A disc unit includes a head that records information onto and/or reproduces information from a disc, a suspension that includes a top surface and a side surface, and supports the head on the top surface, a flexible printed circuit board attached to the side surface of the suspension through an air gap, the flexible printed circuit board transmitting a signal indicative of the information to and from the head, and a damper that damps oscillation of the flexible printed circuit board.

8 Claims, 11 Drawing Sheets

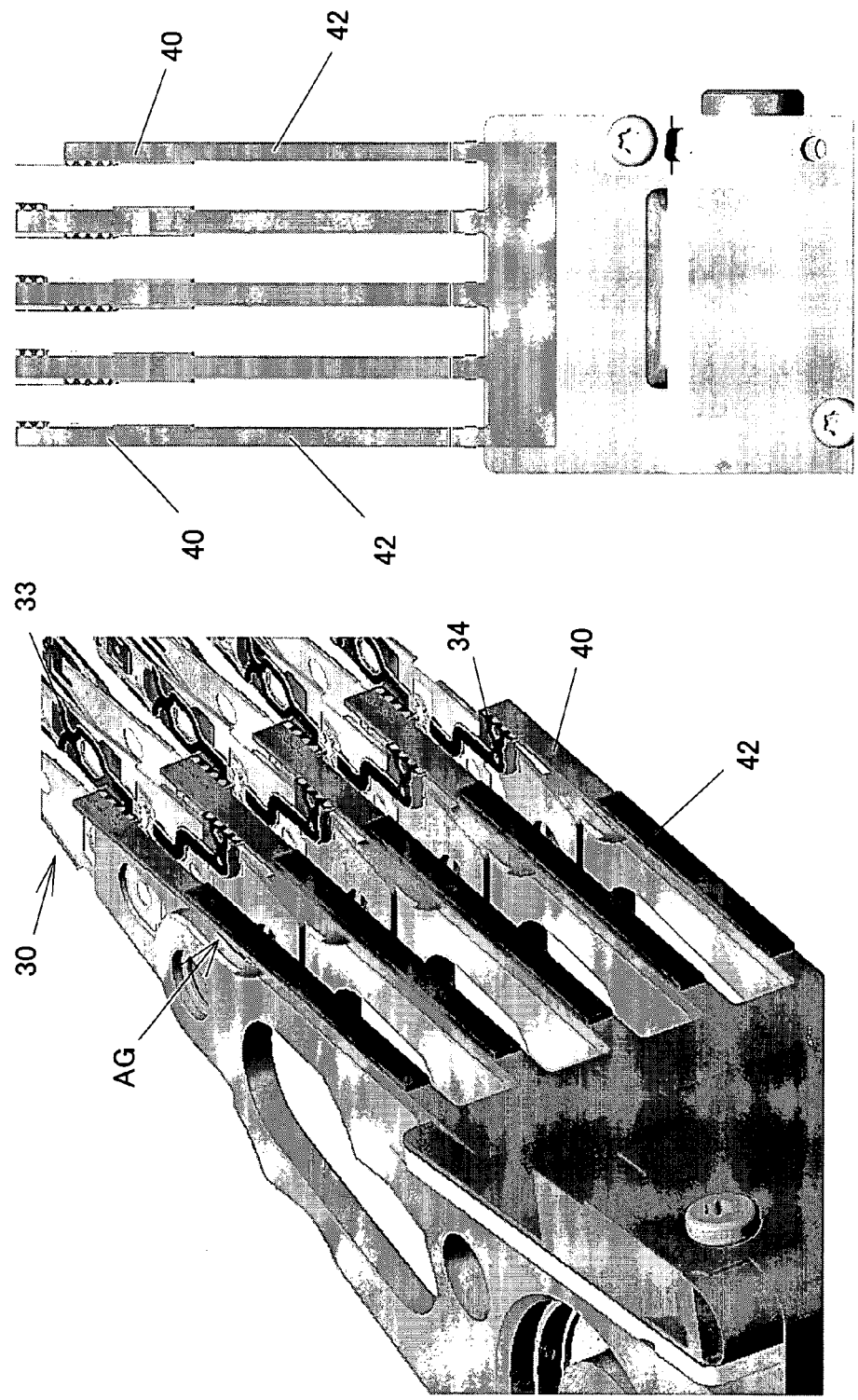

DISC DRIVE ACTUATOR ASSEMBLY WITH TRUNK FLEXIBLE PRINTED CIRCUIT BOARD DAMPING CONFIGURATION

BACKGROUND OF THE INVENTION

The present invention relates generally to a disc unit, and more particularly to a vibration proof mechanism for use with a suspension that supports a head, and a vibration proof disc unit having the suspension. The present invention is suitable, for example, for a magnetic disc unit that realizes high-speed accesses to mass storage capacity for use with a server.

Recent explosively increasing electronic information content has demanded small, low-profile, and fast-access magnetic disc units, such as HDDs, of mass storage or high surface recording density. A typical HDD includes plural discs to be driven by a spindle motor, plural suspensions each mounted with a magnetic head, a head arm or an actuator connected to the suspension to drive them, and means for transmitting a signal to and from the head.

The magnetic head includes a minute head core that records and reproduces signals, and a slider that supports the head core. Each disc is inserted between a pair of suspensions. The head arm is attached to a proximal wide end of the suspension, and the slider is attached to a distal narrow end of the suspension. The suspension has a triangular shape and serves as a flat spring that presses the slider against a disc. A recent suspension has a printed circuit to be connected to the head, and this type of suspension is known as a wireless suspension.

Plural strap-shaped trunk flexible printed circuit boards ("FPC") and one main FPC are typically used as the above signal transmission means. The trunk FPC is connected to the main FPC and soldered to the printed circuit of the suspension. The trunk FPC transmits a signal to and from the head. The main FPC is connected to the plural trunk FPCs, attached to the head arm, and mounted with a preamp IC that amplifies the signal. The trunk FPC is attached to a side surface of the suspension, while the head is provided on a top surface of the suspension. The printed circuit covers from the top surface to the side surface of the suspension. This is because the suspension that arranges trunk FPC on its top surface would be so thick that the disc unit cannot be thin or cause collisions between the trunk FPC and the disc. In an illustrative example, an interval between the suspension and the disc is 0.4 mm and a thickness of the trunk FPC is about 0.1 mm.

When the disc stops, the slider contacts the disc due to the compression force by the suspension. When the disc rotates, the associative airflow occurs between the slider and the disc and floats the slider from the disc surface (contact start stop ("CSS")). A balance between the floating force and the compression force spaces the slider from the disc at a certain distance from the disc. The head arm typically swings and moves the magnetic head to a target position on the disc.

Stable recording and reproducing require the suspension to stabilize seeking by eliminating torsional vibration of a head. The torsional vibration would offset a position of a head from a target position on the disc, causing delayed track servo or inaccessibility.

However, the conventional magnetic disc unit cannot disadvantageously reconcile a demand for miniaturization and a demand for fast access using a high-density disc. The trunk FPC strap is as thick as the side surface of the suspension to avoid influence of the airflow. An air gap exists between the trunk FPC and the side surface of the suspension, because the soldering joint between the printed circuit and the trunk FPC juts out from the side surface of the suspension. This air gap causes turbulence with the airflow, vibrating the trunk FPC. The fast access demand increases a rotational speed of the disc by the spindle motor, and enhances the airflow associated with the rotation. The trunk FPC is thus susceptible to the airflow generated by a rotation of the disc when the suspension swings in a direction orthogonal to the trunk FPC, and would be a vibration source of torsional vibration. The trunk FPC excited by the airflow vibrates the suspension, and deteriorates a positional error signal used to position the head to the target position. Further, the increased surface recording density requires higher precision in positioning the head to a target track. According to the inventors' studies, this vibration of the trunk FPC becomes non-negligible when the rotational speed is higher than 10,000 rpm or higher, the capacity becomes about 70 GB or higher so that the surface recording density is higher than 60,000 dpi or higher.

BRIEF SUMMARY OF THE INVENTION

Accordingly, it is a general object of the present invention to provide a novel and useful suspension and disc unit in which the above disadvantages are eliminated.

Another exemplified and more specific object of the present invention is to provide a suspension and a disc unit, which may improve the positioning accuracy of the head.

A disc unit of one aspect of the present invention includes a head that records information onto and/or reproduces information from a disc, a suspension that includes a top surface and a side surface, and supports the head on the top surface, a flexible printed circuit board attached to the side surface of the suspension through an air gap, the flexible printed circuit board transmitting a signal indicative of the information to and from the head, and a damper that damps oscillation of the flexible printed circuit board. According to this disc unit, the damper damps oscillation or vibrations of the flexible printed circuit board, and improves the positioning accuracy of the head.

The damper may include a first layer, and a second layer, formed on the flexible printed circuit board and connected to the flexible, which elastically transmits the oscillation from the flexible printed circuit board to the first layer. The second layer may be made of a viscoelastic material or a pressure sensitive adhesive double coated tape. The first layer may be made of metal or polyimide. The disc unit may further include a spindle motor that rotates the disc at a speed of 10,000 rpm or higher, wherein the disc has storage capacity of 70 GB or larger. As discussed, the vibration of the FPC becomes non-negligible under this condition.

A disc unit of another aspect of the present invention includes a head that records information onto and/or reproduces information from a disc, and a flexible printed circuit board that transmits a signal indicative of the information to and from the head, the flexible printed circuit board having at least two layers, one layer of which damps vibration generated in the other layer. According to this disc unit, an additional layer in the two layers in the FPC may serve as the above damper.

A disc unit of still another aspect of the present invention includes a head that records information onto and/or reproduces information from a disc, a suspension that supports the head and includes a circuit that is electrically connected to the head, a trunk flexible printed circuit board connected to the circuit of the suspension, the flexible printed circuit board transmitting a signal indicative of the information to and from the head, a main flexible printed circuit board, connected to the trunk flexible printed circuit, which includes a preamp IC that amplifies the signal, and a damper that damps oscillation of the trunk flexible printed circuit board. This disc unit uses a so-called short tail (wireless) suspension, a trunk FPC, and a main FPC. The damper damps oscillation of the flexible printed circuit board, and improves the positioning accuracy of the head. The trunk flexible printed circuit board may be connected to the circuit at a first junction, and the main flexible printed circuit board at a second junction, and wherein the trunk flexible printed circuit board may be fixed to the wireless suspension between the first and second junctions. A shape of this suspension is modified to reduce or eliminate an air gap with the trunk FPC and thus influence of vibration of the trunk FPC.

A disc unit of still another aspect of the present invention includes a head that records information onto and/or reproduces information from a disc, a long tail type suspension that supports said head and includes a circuit that is electrically connected to the head, said suspension including a long tail part that transmits a signal indicative of the information to and from said head, a main flexible printed circuit board connected to the long tail part of said long tail type suspension, said main flexible printed circuit board including a preamp IC that amplifies the signal, and a damper attached to the long tail part of said long tail type suspension. This disc unit uses a so-called long tail suspension, and a main FPC. The damper damps oscillation of the long tail of part of the suspension, and improves the positioning accuracy of the head. The long tail type suspension may be connected to the main flexible printed board by a flying lead or a soldering bump. The flying lead joints them using ultrasonic wave while exposing conductors.

A long tail type suspension of another aspect of the present invention that supports a head that records information onto and/or reproduces information from a disc includes a circuit that is electrically connected to the head, the suspension serving as a trunk flexible printed circuit board connected to the circuit of the suspension, the flexible printed circuit board transmitting a signal indicative of the information to and from the head, the suspension being connected to a main flexible printed circuit board, connected to the long tail type suspension, which includes a preamp IC that amplifies the signal, and a damper that damps oscillation of the long tail type suspension.

Other objects and further features of the present invention will become readily apparent from the following description of the embodiments with reference to accompanying drawings.

BRIEF DESCRIPTION OF THE DRAWINGS

FIG. 9 is an enlarged perspective view near the trunk FPC.

FIG. 10 is a side view of FIG. 4.

DETAILED DESCRIPTION OF THE INVENTION

Figure 1:
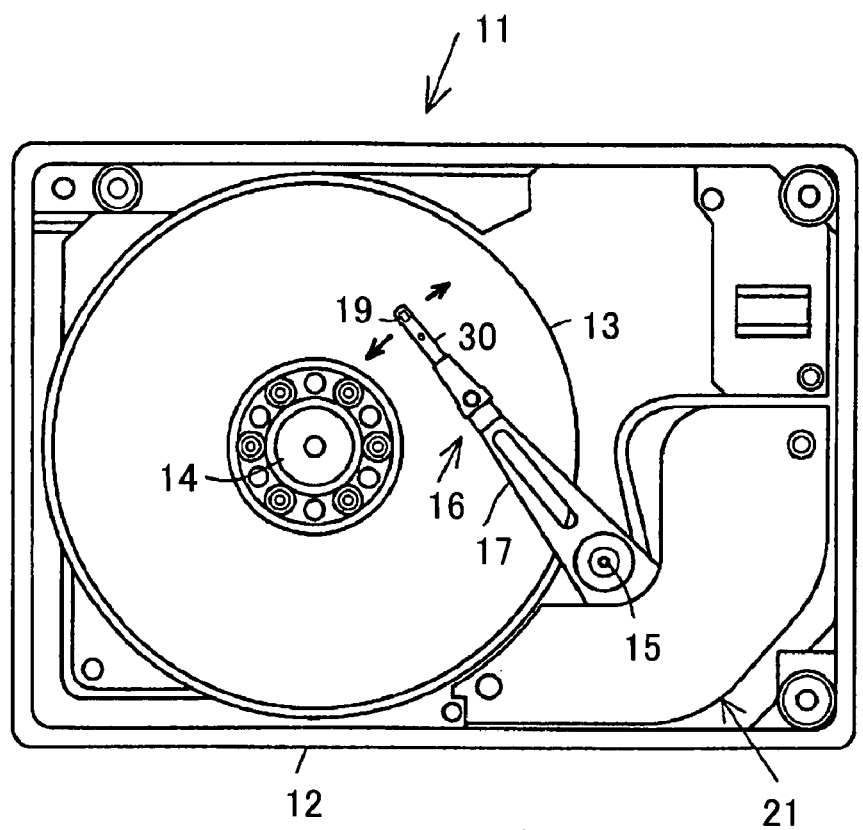
FIG. 1 is a plane view showing an internal structure of a hard disc drive ("HDD") of one embodiment according to the present invention.

Referring now to accompanying drawings, a description will be given of HDD 11 as one embodiment according to the present invention. The HDD 11 of this embodiment is used, for example, for a server. The HDD 11 includes, in a housing 12 as shown in FIG. 1, one or more magnetic disc(s) 13, a spindle motor 14, and a magnetic head part. FIG. 1 is a plane view showing an internal structure of the HDD 11.

The housing 12 is made, for example, of aluminum die casting or stainless, and has a rectangular parallelepiped shape to which a cover (not shown) is coupled so as to seal its internal space. Each magnetic disc 13 in this embodiment has high recording density, such as 70 $GB/in^2$ or higher, and is mounted on a spindle of the spindle motor 14.

The spindle motor 14 rotates the magnetic disc 13 at a high speed, such as 10,000 rpm or higher, and includes a brushless DC motor and a spindle as its rotor part. For example, when two magnetic discs 13 are used, a disc, a spacer, a disc, and a clamp are stacked in this order on the spindle, and fixed by a bolt engaged with the spindle. Unlike this embodiment, the magnetic disc 13 may be a disc having a hub without a center hole, and the spindle rotates the disc through the hub.

The magnetic head part includes a slider 19, and an actuator 21 that serves as a mechanism for positioning and driving the slider 19.

Figure 2:
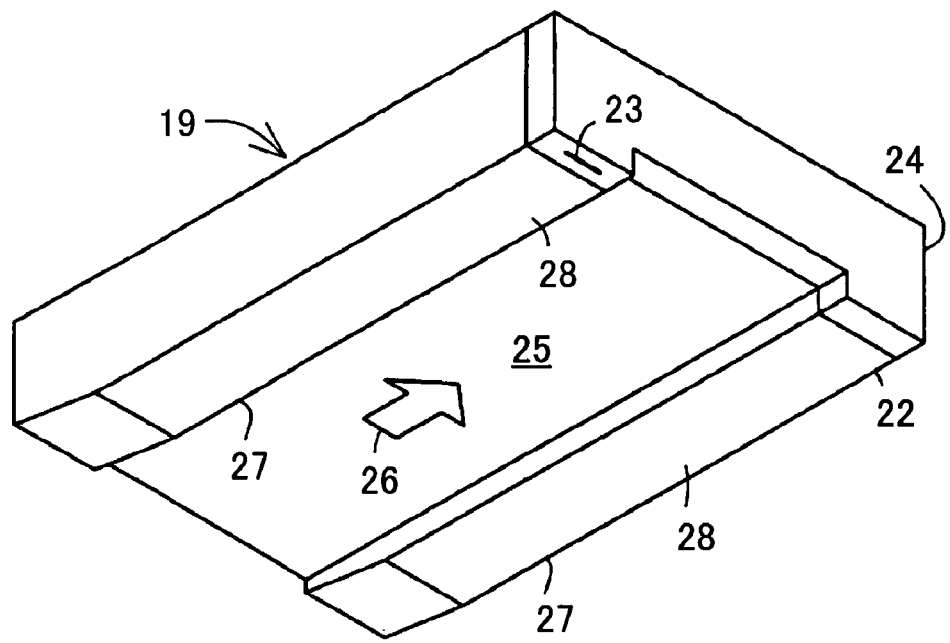
FIG. 2 is an enlarged perspective view of a slider of the HDD shown in FIG. 1.

The slider 19 includes, as shown in FIG. 2, a slider body 22 having an approximately rectangular parallelepiped shape made of $Al_2O_3$—TiC ("altic"), and a head-device built-in film 24 united with at an air outflow end of the slider body 22 and made of $Al_2O_3$ ("alumina"), the film 24 including a built-in read/write head 23. Here, FIG. 2 is an enlarged perspective view of the slider 19. The slider body 22 and head-device built-in film 24 define a floatation surface 25 as a surface opposite to a carrier, i.e., the magnetic disc 13, for catching air current 26 generated from the rotating magnetic disc 13.

A pair of rails 27 are formed on the floatation surface 25, extending from an air inflow end to the air outflow end. A so-called air-bearing surface (referred to as "ABS" hereinafter) 28 is defined at a top surface of each rail 27. The buoyancy is generated at the ABS 28 according to an act of the air current 26. The head 23 embedded in the head-device built-in film 24 exposes at the ABS 28. The floatation system of the slider 19 is not limited to this form, but may use a known dynamic pressure lubricating system, a known static pressure lubricating system, a known piezoelectric control system, and any other known floatation system. Unlike the instant embodiment which uses a contact start stop system in which the slider 19 contacts the disc 13 at the time of stop, the slider 19 may be lifted up over the disc 13 before the disc 13 stops, held at a holding part (sometimes referred to as a ramp) located outside the disc 13 so as to hold the slider 19 in a non-contact manner with the disc 13, and dropped from the holding part over the disc 13 when the disc 13 is run, as in the dynamic or ramp loading system.

The head 23 includes a magnetoresistive/inductive composite head including an inductive head device for writing binary information into the magnetic disc 13 using a magnetic field induced by a conductive coil pattern (not shown), and a magnetoresistive ("MR"hereinafter) head device for reading resistance as binary information changing according to a magnetic field generated by the magnetic disc 13. The instant embodiment applies the sense current perpendicular to a direction of lamination (Current Perpendicular to Plane Giant Magnetoresistive ("CPP-GMR")). Of course, the present invention does not exclude a Giant Magnetoresistive using the Current in Plane ("CIP") configuration ("CIP-GMR" hereinafter). The present invention is applicable to Tunneling Magnetoresistive ("TMR") and Anisotropic Magnetoresistive ("AMR") in addition to the GMR.

Turning back to FIG. 1, the actuator 21 includes a voice coil motor (not shown in FIG. 1), a support shaft 15, and a carriage 16.

The voice coil motor may use any technology known in the art, and a detailed description thereof will be omitted herein. For example, the voice coil motor includes a permanent magnet fixed onto an iron plate fixed in the housing 12, and a mobile magnet fixed onto the carriage 16. The support shaft 15 is inserted into a cylindrical hollow hole in the carriage 16, and arranged such that it extends perpendicular to the paper surface in FIG. 1 in the housing 12. The carriage 16 includes a rigid head arm 17 rotatably or swingably around the support shaft 15, and a suspension 30 that is attached to an end of the head arm 17 and extends forward from the arm 17. The instant embodiment connects the suspension 30 to the head arm 17 through a spacer, and considers the spacer to be part of the suspension. Of course, the present invention is applicable to the suspension that is directly connected to the head arm without the spacer.

Figure 3:
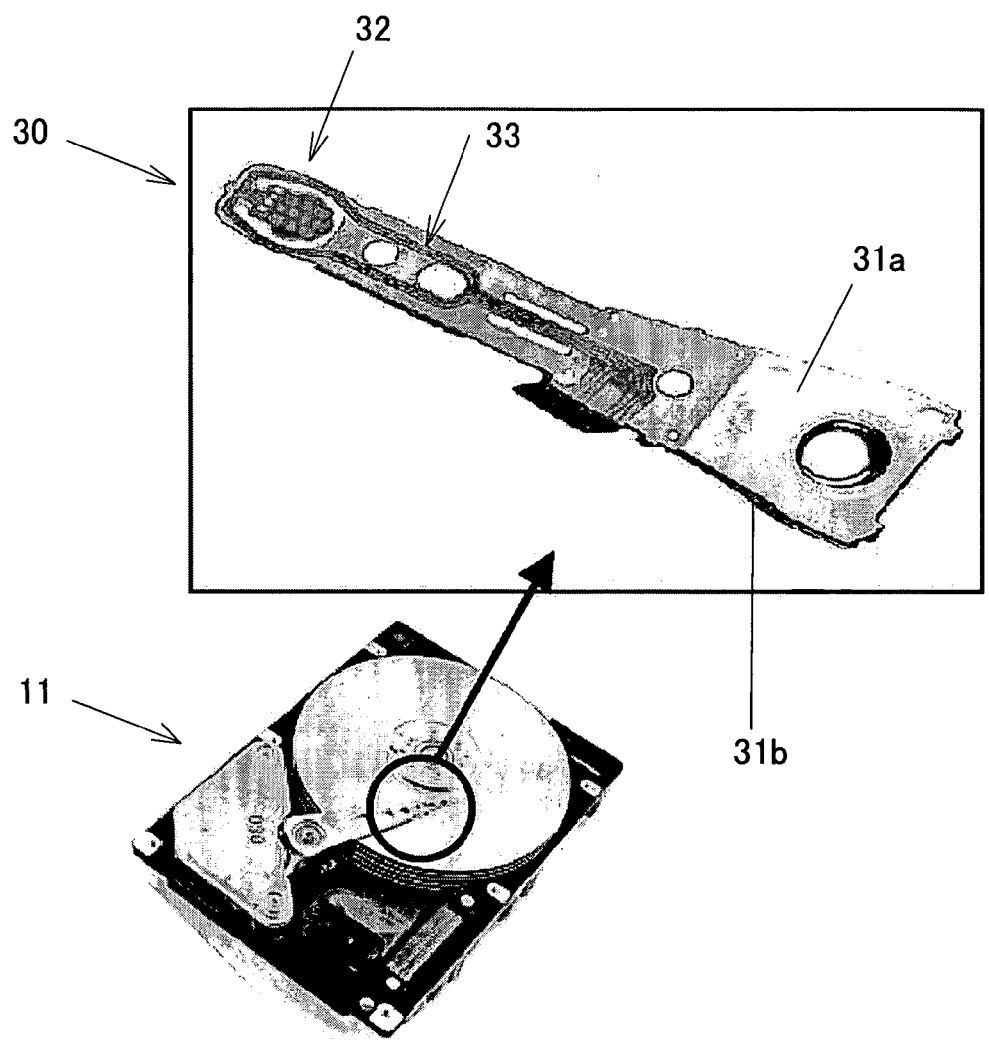
FIG. 3 is an enlarged view of a suspension in the HDD shown in FIG. 1.
Figure 4:
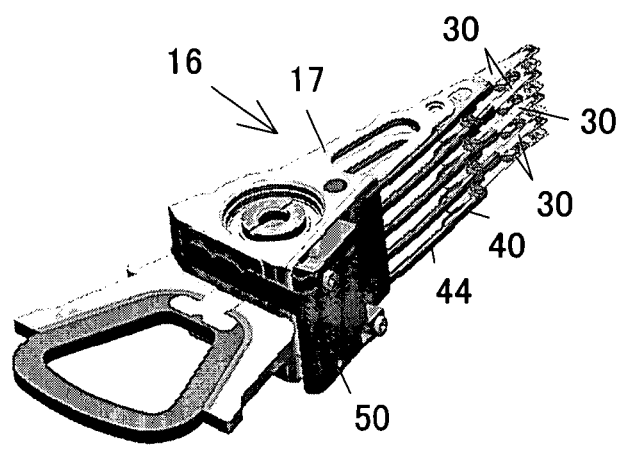
FIG. 4 is a carriage in the HDD shown in FIG. 1.
Figure 5:
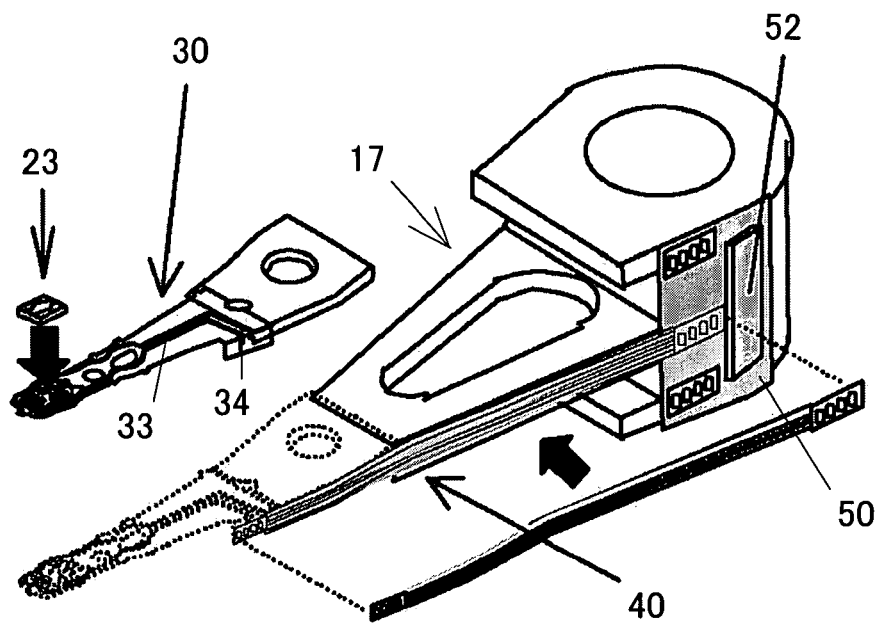
FIG. 5 is a schematic perspective view of the suspension, a trunk FPC, a main FPC and a preamp IC used for the HDD shown in FIG. 1.
Figure 6:
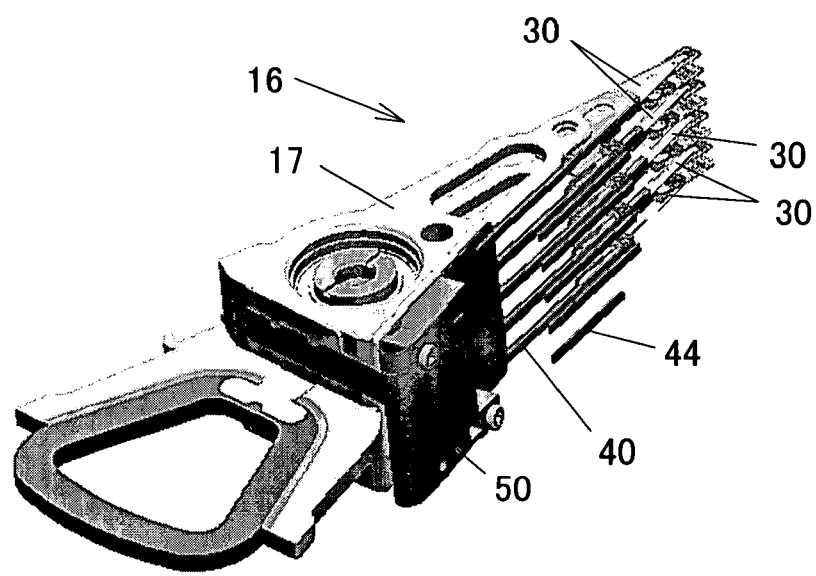
FIG. 6 is an exploded perspective view of FIG. 4 to clearly show a structure of the trunk FPC shown in FIG. 5.
Figure 7:
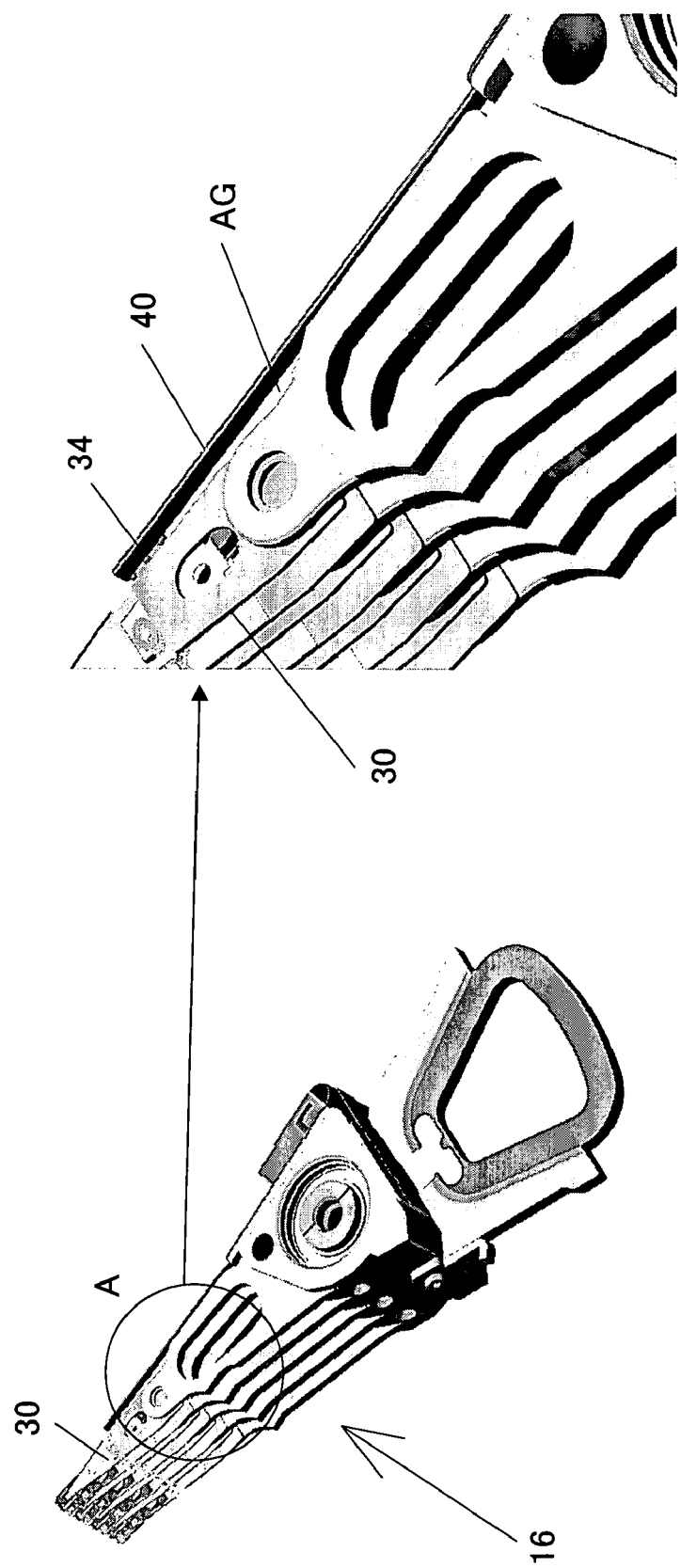
FIG. 7 is a partial enlarged view to show an air gap between the trunk FPC and a side surface of the suspension in the HDD shown in FIG. 1.
Figure 8:
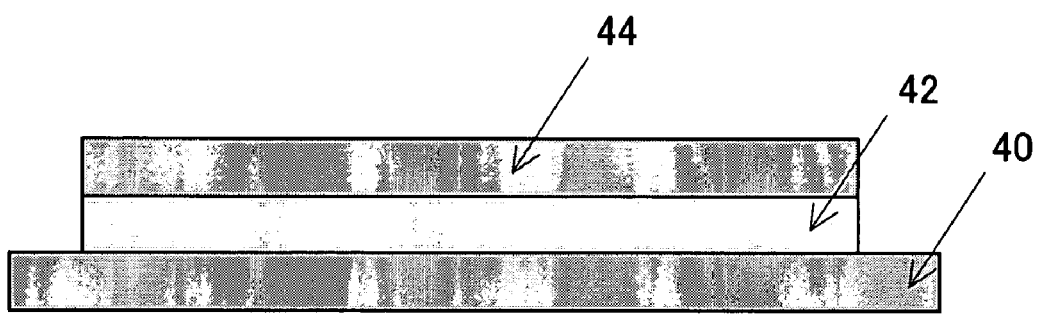
FIG. 8 is a schematic sectional view of the structure of the trunk FPC shown in FIG. 6.
Figure 11:
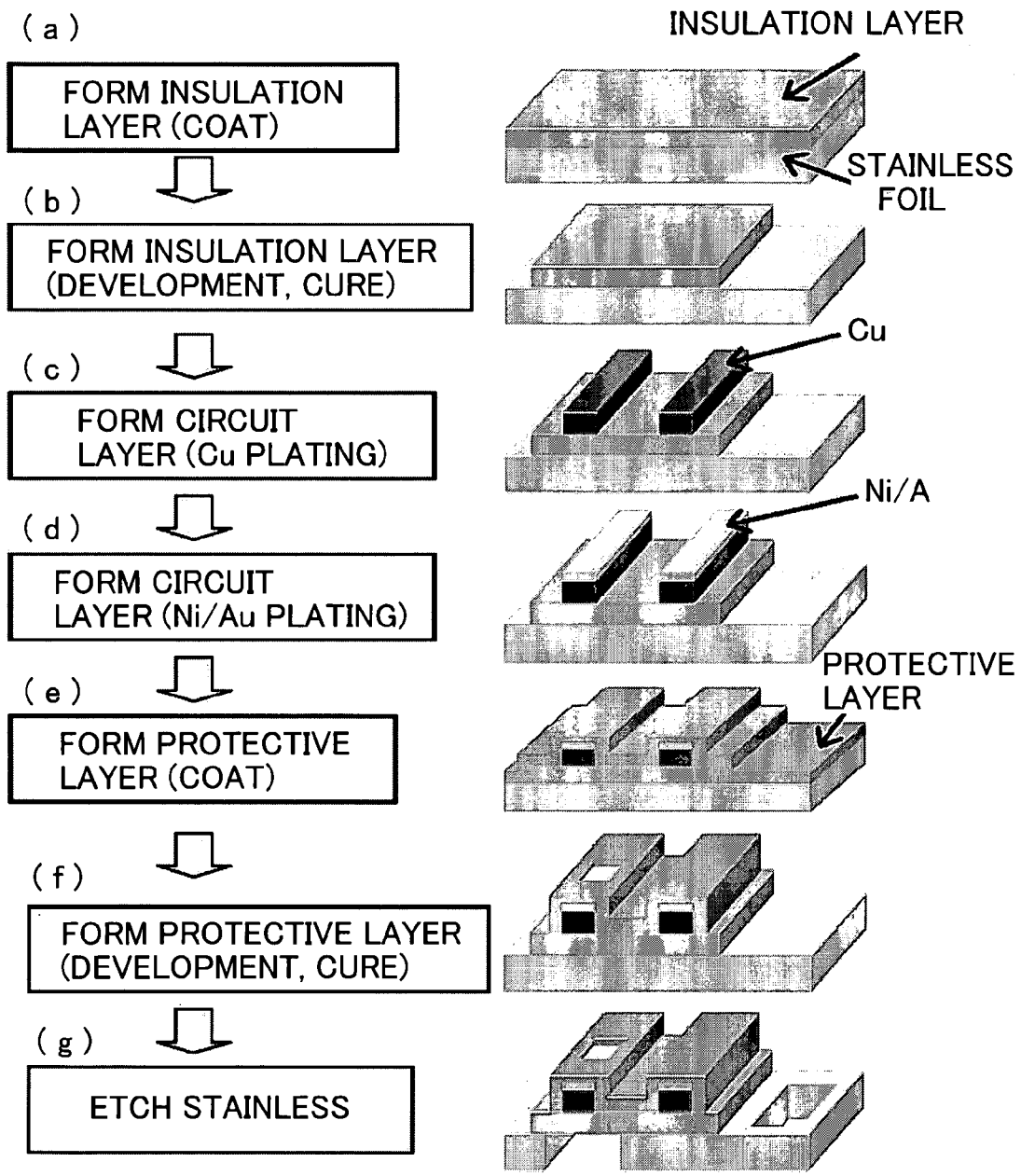
FIG. 11 is a flowchart for the way of manufacturing the suspension shown in FIG. 3.

A detailed description will be given of the suspension 30 with reference to FIGS. 3–11. Here, FIG. 3 is an enlarged view of a suspension in the HDD 11. FIG. 4 is a perspective view of the carriage 16. FIG. 5 is a perspective view of the suspension 30, a trunk FPC 40, a main FPC 50 and a preamp IC 52. FIG. 6 is an exploded perspective view of FIG. 4 to indicate a damper 44. FIG. 7A is a perspective view of the carriage 16 viewed from a different angle from FIG. 4, and FIG. 7B is a partial enlarged perspective view of area "A" in FIG. 7A to show an air gap AG between the trunk FPC 40 and a side surface 31b of the suspension 30. FIG. 8 is a schematic sectional view of the structure of the trunk FPC 40. FIG. 9 is an enlarged perspective view of the suspension 30 near the trunk FPC 40. FIG. 10 is a side view of FIG. 4. FIG. 11 is a flowchart for explaining a circuit pattern 33 on the suspension 30.

Referring to FIG. 3, the suspension 30 has a top surface 31a and side surface 31b, and is connected to the head arm 17. The suspension 30 is made of stainless, for example, and cantilevers the slider 19 at its head mounting section 32 on the top surface 31a. The suspension 30 applies an elastic force to the slider 19 against a surface of the magnetic disc 13. The suspension 30 is a so-called (short tail) wireless suspension that has a printed circuit 33 on its top surface 31a. Such a suspension is sometimes referred to as a cable patterned suspension.

The wireless suspension connects the head 23 with the trunk FPC 40, which will be described later. The wireless suspension 30 forms a printed circuit 33 through thin film circuit technology (which is sometimes referred to as Giga scale Trace integrated on Metal ("GTRiM")) that uses, for example, photosensitive polyimide as heat-resistant insulation and Cu plating as a conductive material with low resistance. More specifically, as shown in FIG. 11, a stainless foil is coated with an insulation layer made of photosensitive polyimide, developed and cured (Steps (a) and (b)). Next, plated or circuit part is formed using photosensitive resist, Cu plating, and Ni/Au plating (Steps (c) and (d)). Next, a protective layer is then formed (Steps (e) and (f)). Finally, the stainless is etched into a suspension shape (Step (g)). As shown in FIG. 3, the printed circuit 33 that extends from the head mounting part 32 is bent at a right angle on the top surface 31a toward the side surface 31b.

There are plural suspensions 30 as shown in FIG. 4. A magnetic disc 13 is inserted between a pair of suspensions 30. FIG. 5 schematically shows one of suspensions 30, the trunk FPC 40, and the main FPC 50, although the trunk FPC 40 and the main FPC 50 are attached to an opposite side surface of the suspension 30 to FIG. 4 for illustrative purposes. In addition, FIG. 5 omits the constraint layer 44 to be layered on the trunk FPC 40 for illustrative purposes.

The trunk FPC 40 has a strap shape and serves as means for transmitting a signal to the head 23 from the main FPC 50 and from the head to the main FPC 50 through the printed circuit 33. As shown in FIG. 5, one end of the trunk FPC 40 is soldered to a bent portion 34 of the printed circuit 33 on the side surface 31b of the suspension 30. Therefore, the bent portion or soldering portion 34 juts out of the side surface 31b of the suspension 30. The other end of the trunk FPC 40 is connected to the main FPC 50. Thus the trunk FPC 40 is attached to the side surface 31b of the suspension 30, because if the suspension 30 arranges the trunk FPC 40 on its top surface 31a, the suspension 30 becomes so thick that the HDD 11 cannot be thin or cause collisions between the trunk FPC 40 and the disc 13. In an illustrative example, an interval between the suspension 30 and the disc 13 is 0.4 mm and a thickness of the trunk FPC 40 is about 0.1 mm. 0.1 mm is too thick to be inserted into 0.4 mm.

The suspension 30 is not a perfect triangle shape, which has been hydrodynamically determined for weight reduction and smooth swing in the airflow generated by a rotation of the disc 13. As a result, as shown in FIG. 7B, an air gap or aperture AG exists between the trunk FPC 40 and the side surface 31b of the suspension 30. This air gap inevitably exists due to the projecting soldering portion 34. Of course, the air gap is reduced when the trunk FPC 40 is adhered along the side surface 31b of the suspension 30, but such an adhesion is arduous. On the other hand, this air gap AG and the airflow would vibrate the trunk FPC 40 and the vibration propagates back to the suspension 30. As a result, the head 23 would vibrate and have a difficulty to be positioned at a target position on the disc 13. The recent high speed mass storage disc 13 cannot ignore the positioning inaccuracy of the head 23.

Accordingly, the instant embodiment provides the trunk FPC with a damper for damping the vibration caused by the air gap AG and the airflow. The damper damps oscillations or vibrations generated in the trunk FPC 40, and improves the positioning accuracy of the head 23. Referring to FIGS. 6, 8 and 9, the trunk FPC 40 is connected to the damper or constraint layer 44 through an elastic layer 42. The elastic layer 42 elastically transmits vibration generated in the trunk FPC 40 to the constraint layer 44. The elastic layer 42 is made, for example, of a viscoelastic material or a pressure sensitive adhesive double coated tape. The constraint layer 44 is made, for example, of metal or polyimide, but a material of the constraint layer 44 is not limited. This layer structure is formed by layering the elastic layer 42 and constraint layer 44 on the trunk FPC 40, and then die-cutting the layer structure into a strip shape.

As shown in FIG. 8, the length of the constraint layer 44 is shorter than the trunk FPC 40, because the soldering becomes difficult when the constraint layer 44 covers the soldering part 34. Nevertheless, the present invention does not limit the length of the constraint layer 44. Since the airflow enters the air gap AG and becomes turbulence that vibrates the trunk FPC 40, it is preferable that the constraint layer 44 covers the air gap AG. A thickness of the elastic layer 42 is not limited, and a thickness of the constraint layer 44 is not limited. The too short thickness and/or length of the constraint layer 44 would make the damping effect insignificant. Therefore, they should be determined in view of necessary damping effect. More specifically, the instant embodiment determines whether the necessary damping is maintained by determining whether a gain is sufficiently reduced on a specific oscillation frequency, as described later with reference to FIG. 17.

As shown in FIG. 10, it is understood that the trunk FPC 40 and the constraint layer 42 are as wide as the side surface 31*b* of the suspension 30 to avoid influence of the airflow, because when the trunk FPC 40 or the constraint layer 42 is wider than the side surface 31*b*, it would become susceptible to the airflow when the head arm 17 swings. Of course, the present invention does not limit the trunk FPC 40 or the constraint layer 42 is narrower than the side surface 31*b* of the suspension 30.

As shown in FIG. 5, the main FPC 50 includes a preamp IC 52, and serves as means for transmitting a signal to the trunk FPC and from the trunk FPC 40 to the preamp IC 52. The main FPC is connected to the plural trunk FPCs 40, and attached to a proximal end of the head arm 17. The preamp IC 52 amplifies the signal.

Figure 12:
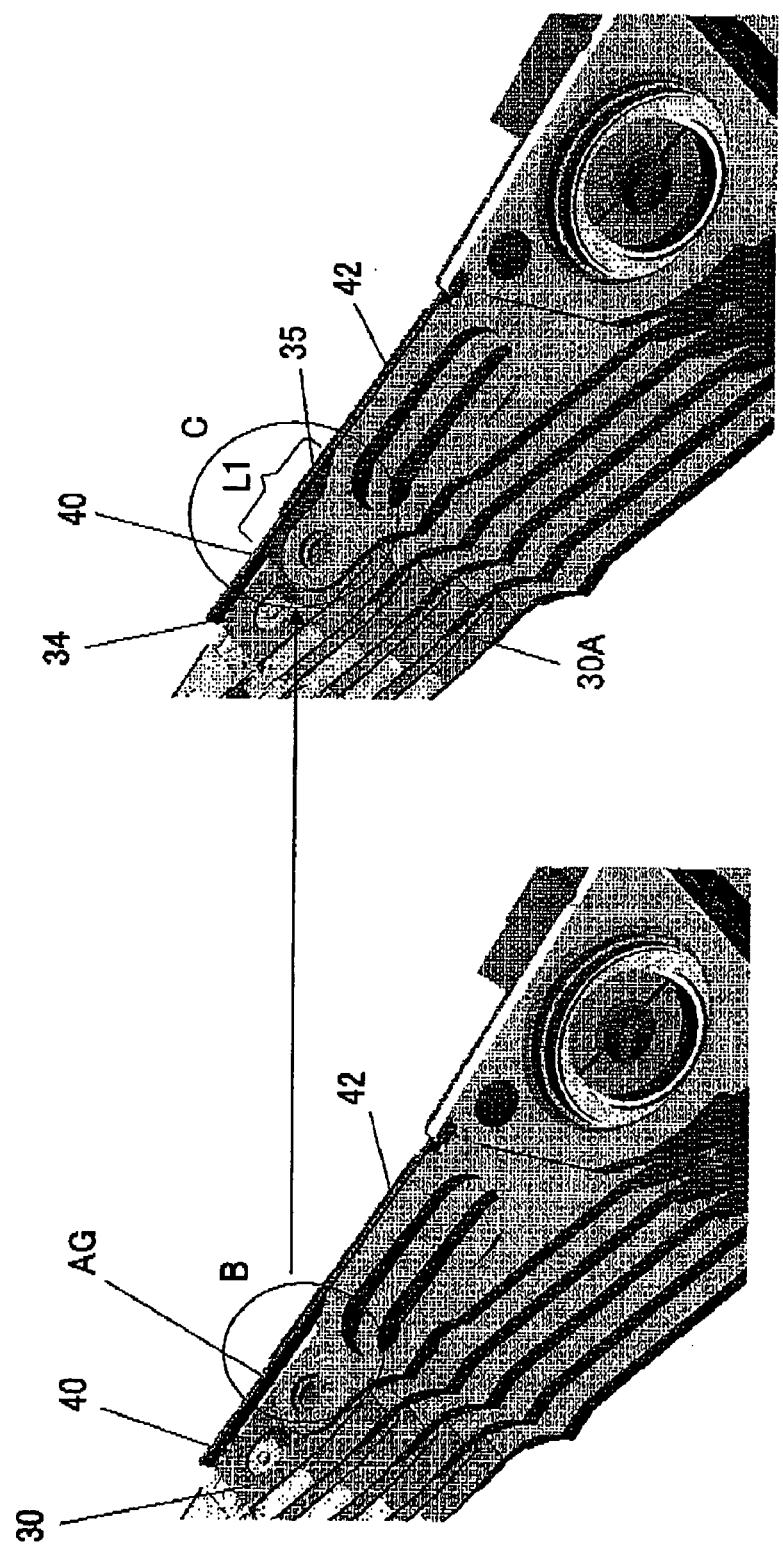
FIG. 12 is a schematic perspective view of a variation of the suspension shown in FIG. 7.

A description will be given of a suspension 30A as a variation of a shape of the suspension 30 with reference to FIG. 12. Here, FIG. 12A corresponds to FIG. 7B and FIG. 12B shows a partially enlarged perspective view of the suspension 30A, which modifies area "B" in FIG. 12A to area "C".

The suspension 30A shown in FIG. 12B partially fills the air gap AG with extended part 35. When the extended part 35 is made of the same material as the suspension 30, it may be formed in molding the suspension 30A. Alternatively, the extended part 35 may be made of a material different from the suspension 30, such as sponge. The instant embodiment sets the extended part 35 to be as thick as the suspension 30A, but the present invention includes the extended part 35 that is narrower than the suspension 30A: The extended part 35 has a length L1 for connection with the trunk FPC 40, and the suspension 30A has a larger connection length with the trunk FPC 40 than the suspension 30 by the length L1. In other words, the vibrating length of the trunk FPC 40 reduces by the length L1. The connection at the extended part 35 may use adhesives. For example, the extended part 35 may be connected to the trunk FPC 40 through adhesive or a pressure sensitive adhesive double coated tape. Of course, the present invention does not limit the way of connecting the extended part 35 and the trunk FPC 40 to each other. As a result, the trunk FPC 40 is less susceptible to the vibration in the suspension 30A than that in the suspension 30. The present invention does not limit the length L1, and may extend the length L1 to the entire air gap AG if the soldering part 34 between the trunk FPC 40 and the printed circuit 33 may be maintained.

Figure 13:
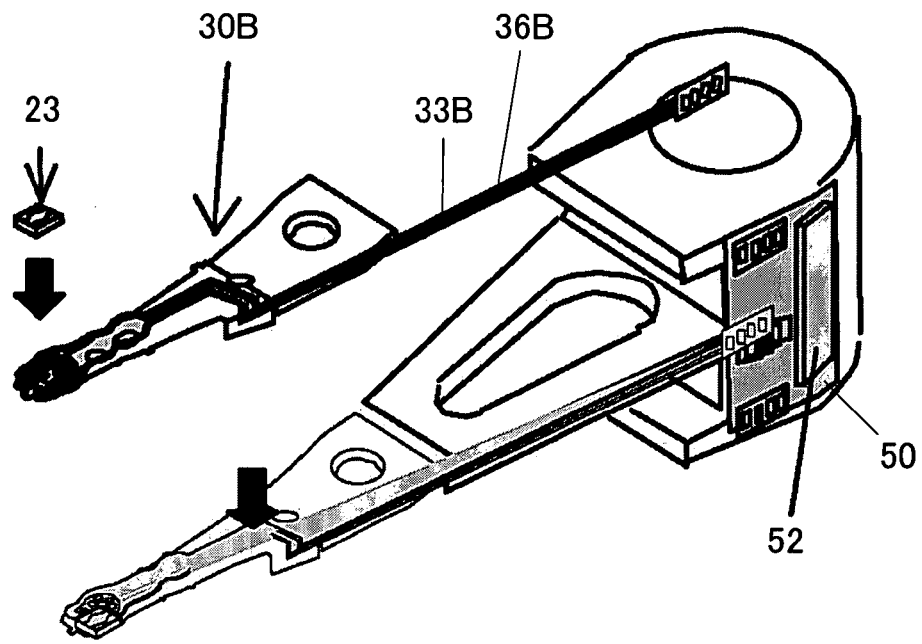
FIG. 13 is a schematic perspective view of a variation of the suspension shown in FIG. 5, a main FPC and a preamp IC.
Figure 14:
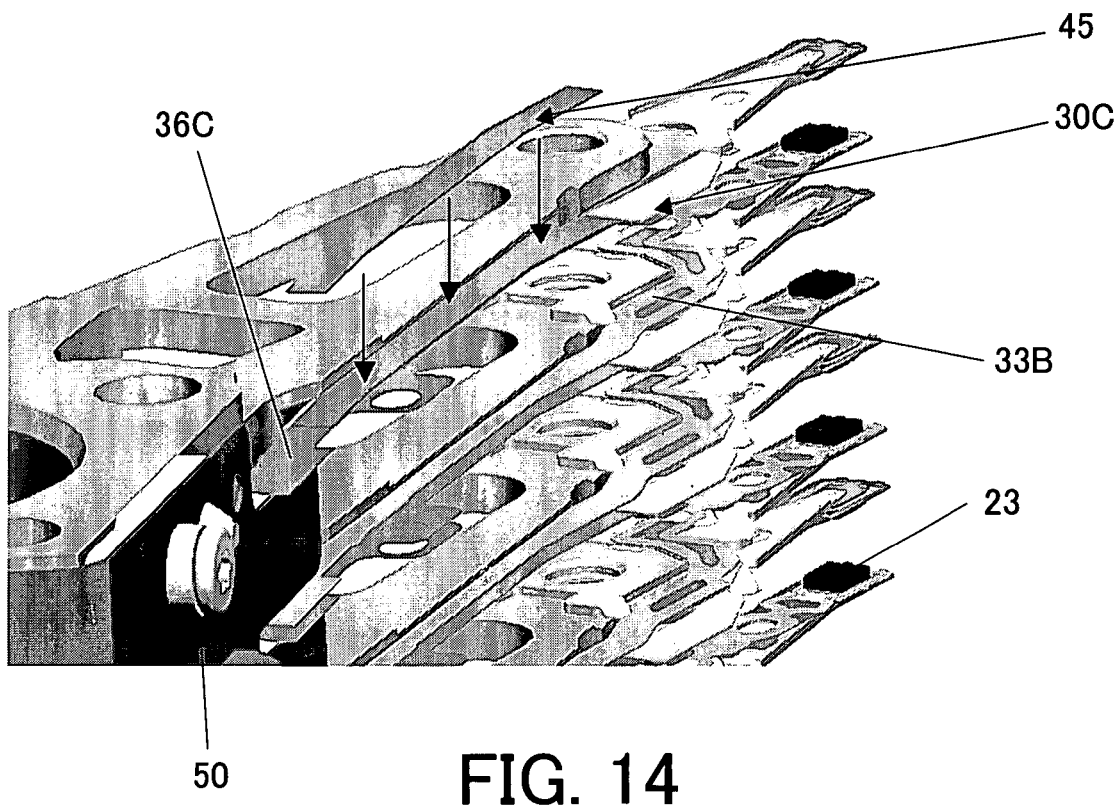
FIG. 14 is a partially exploded, enlarged perspective view of the suspension shown in FIG. 12.

A description will be given of a long tail suspension 30B as another variation with reference to FIGS. 13 and 14. Here, FIG. 13 is a schematic perspective view of the suspension 30B, the main FPC 50 and the preamp IC 52. FIG. 14 is a partially exploded, enlarged perspective view of the suspension 30C. FIG. 13 corresponds to FIG. 5, and omits a damper member 45 for illustrative purposes. Long tail part 36B and 36C is arranged at opposite (i.e., left and right) sides between FIGS. 13 and 14 for illustrative purposes.

Figure 15:
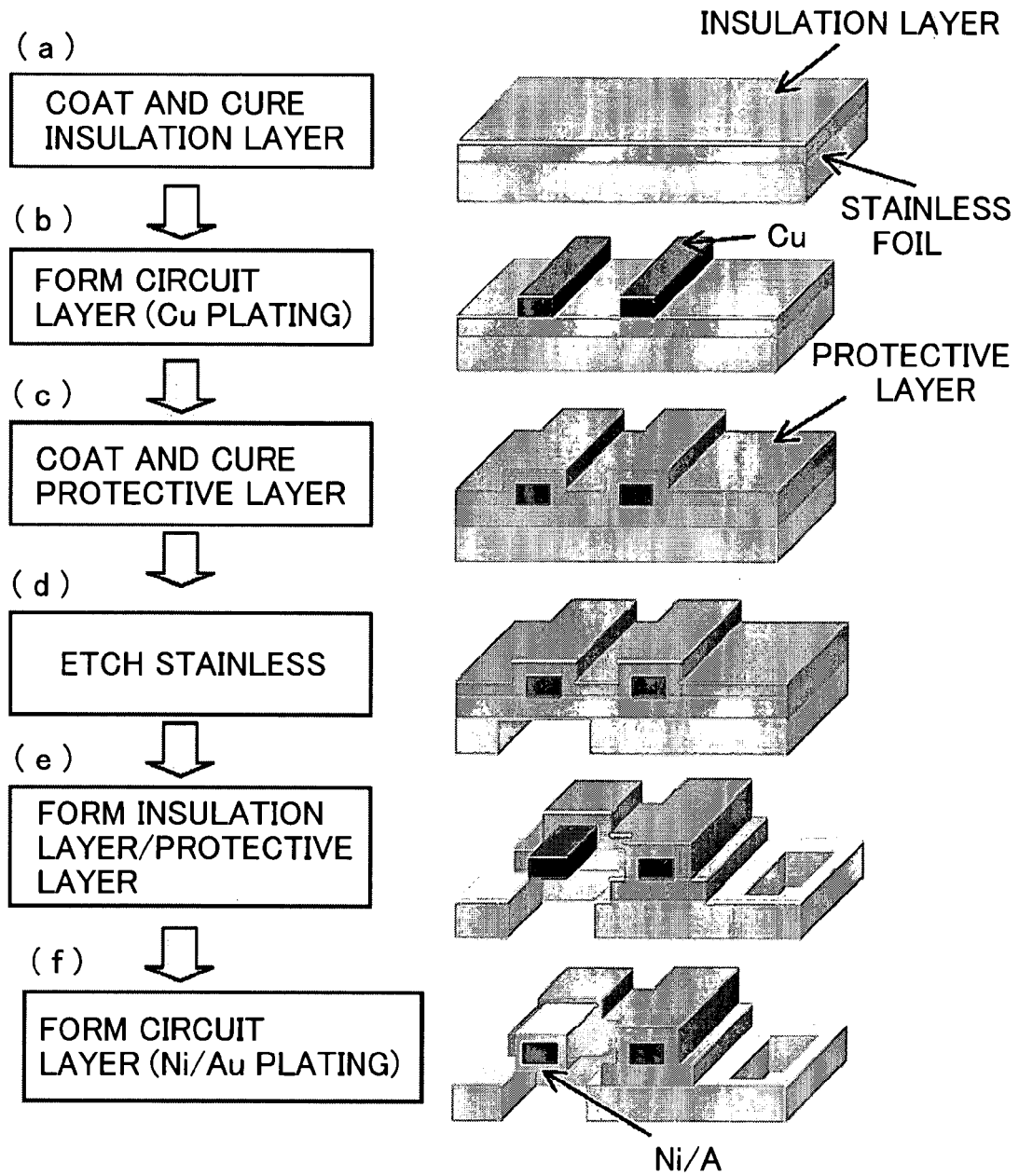
FIG. 15 is a flowchart for the way of manufacturing the suspension shown in FIG. 3.

The suspensions 30B 30C are a so-called long tail suspension, which integrates the trunk FPC 40 and the suspension 30 for impedance matching. The long tail part 36B in FIG. 13 is bent from a body of the suspension 30B by a right angle in FIG. 13, while the long tail part 36C is parallel to the body of the suspension 30C in FIG. 14. The present invention is applicable to both shapes of the long tail part. The wireless suspension 30B and 30C forms a printed circuit 33B through GTRiM that uses, for example, non-photosensitive polyimide as insulation and Cu plating as a conductive material with low resistance. More specifically, as shown in FIG. 15, a stainless foil is coated with an insulation layer made of non-photosensitive polyimide and cured (Step (a)). Next, plated or circuit part is formed using Cu plating (Step (b)). Then, after the protective layer is coated and cured (Step (c)), a pattern is formed using etching simultaneous with a formation of an insulation layer (Step (d) and (e)). Finally, a circuit layer is formed using Ni/Au plating (Step (f)).

A connection of the printed circuit 33B to the main FPC 50 may use a flying lead or a solder bump. The flying lead uses ultrasonic to joint two conductors while exposing them.

As shown in FIGS. 13 and 14, the suspension 30B and 30C have a damper member 45 on the printed circuit 33B. The damper member 45 is made of insulation, such as polyimide, and serves as the constraint layer 44. The elastic member 42 (not shown) is inserted between the damper member 45 and each of the long tail part 36B and 36C. The long tail parts 36B and 36C are extended parts, and susceptible to the airflow generated by a rotation of the disc 13. More specifically, the airflow swirls around and vibrates the long tall parts 36B and 36C. The damper member 45 successfully damps the vibrations of the long tail parts 36B and 36C.

Figure 17:
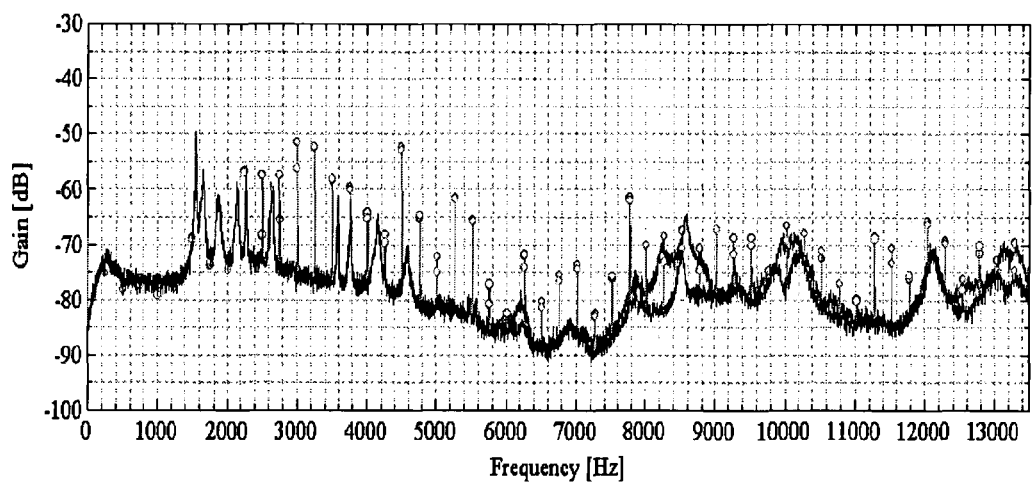
FIG. 17 is a graph for explaining an effect of the two-layer trunk FPC shown in FIG. 8.

FIG. 17 shows a control block diagram of a control system 70 in the HDD 11. A control system 70, which may be implemented as a control board in the HDD 11, includes a control part 71, an interface 72, a hard disc controller (referred to as "HDC" hereinafter) 73, a write modulation part 74, a read demodulation part 75, a sense-current control part 76, and the preamp 52.

Figure 16:
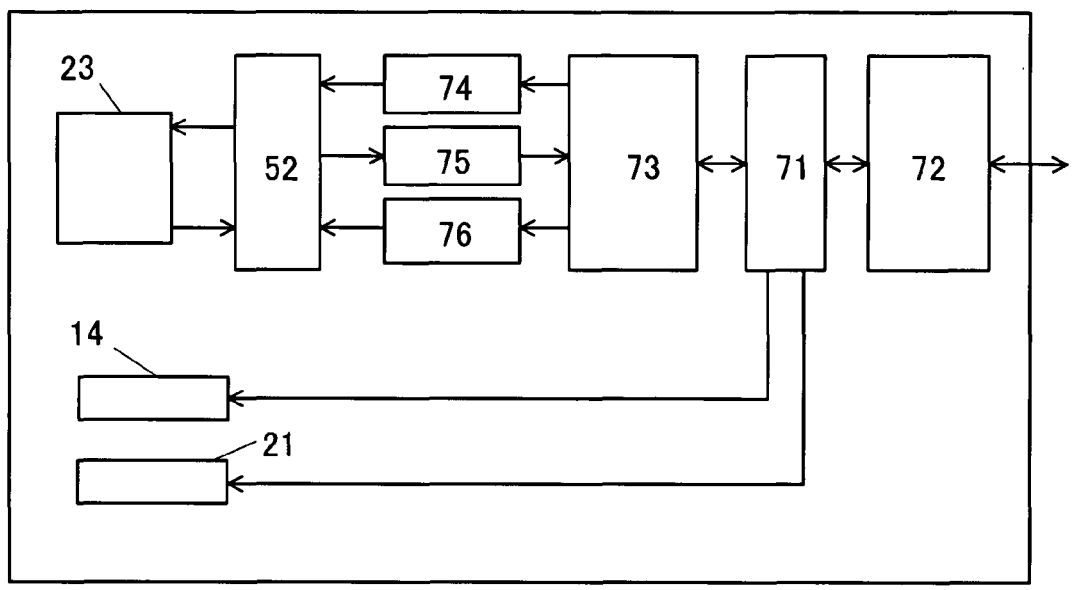
FIG. 16 shows a block diagram of a control system in the HDD shown in FIG. 1.

The control part 71 covers any processor such as a CPU and MPU irrespective of its name, and controls each part in the control system 70. The interface 72 connects the HDD 11 to an external apparatus, such as a personal computer ("PC" hereinafter) as a host. The HDC 73 sends to the control part 71 data that has been demodulated by the read demodulation part 75, sends data to the write modulation part 74, and sends to the sense-current control part 76 a current value as set by the control part 71. Although FIG. 16 shows that the control part 71 provides servo control over the spindle motor 14 and (a motor in) the actuator 21, the HDC 73 may serve as such servo control. The write modulation part 74 modulates data and supplies data to the head IC 72, which data has been supplied from the host through the interface 72 and is to be written down onto the disc 13 by the inductive head. The read demodulation part 75 demodulates data into an original signal by sampling data read from the disc 13 by the MR head device 50. The write modulation part 74 and read demodulation part 75 may be recognized as one signal processing part. Each part may apply any structure known in the art, and a detailed description thereof will be omitted.

In operation of the HDD 11, the control part 71 drives the spindle motor 14 and rotates the disc 13 at a speed of, for example, 10,000 rpm or higher. The airflow associated with the rotation of the disc 13 is introduced between the disc 13 and slider 19, forming minute air film and thus generating the buoyancy that enables the slider 19 to float over the disc surface. The balance between the floating force and the elastic force spaces the slider 19 from the disc 13 by a constant distance.

The airflow enters the air gap AG and vibrates the trunk FPC 40 or swirls around the long tail parts 36B and 36C in the suspensions 30B and 30C. Since the vibration generated in the trunk FPC 40 due to the airflow is propagated to the constraint layer 44 via the elastic member 42 in FIG. 8 and damped by the constraint layer 44, the suspension 30 is less susceptible to the vibration. Since the size of the air gap AG is reduced and the trunk FPC 40 is adhered to the elongated part 35, the suspension 30A is less susceptible to the vibration. Since the damper member 45 damps the vibrations generated in the long tail parts 36B and 36C, the suspensions 30B and 30C are less susceptible to the vibration. As a result, the head 23 provided on the suspension 30, 30A and 30B may be positioned to a target position with high precision.

EXAMPLE

When the constraint layer 44 is made of polyimide having a thickness of 50 μm and the elastic member 42 is made of a viscoelastic material in the structure shown in FIG. 4, the gain reduces at frequency of about 8,000 Hz or higher, as shown in FIG. 17. In FIG. 17, a red line corresponds to the prior art structure (i.e., the structure shown in FIG. 4 without the constraint layer 44) and a blue line corresponds to the inventive structure shown in FIG. 4. As discussed, the instant embodiment may sets the necessary damping based on the gain reduced at the target specific oscillation frequency, e.g., about 8,000 Hz or higher.

The control part 71 then controls the actuator 21 and rotates the carriage 16 around the support shaft 15 for head 23's seek for a target track on the disc 13. The instant embodiment thus uses a swing arm type in which the slider 19 draws an arc locus around the support shaft 15, but the present invention is applicable to a linear type in which the slider 19 is a linear locus.

The control part 71 receives data from the host such as a PC through the interface 72, selects the inductive head device, and sends data to the write modulation part 74 through the HDC 73. In response, the write modulation part 74 modulates the data, and sends the modulated data to the preamp 52. The preamp 52 amplifies the modulated data, and then supplies the data as write current to the inductive head device. Thereby, the inductive head device writes down the data onto the target track.

In the read time, the control part 71 selects the MR head device, and sends the predetermined sense current to the sense-current control part 76 through the HDC 73. In response, the sense-current control part 76 supplies the sense current to the MR head device through the preamp 52.

When the MR head device is the CPP-GMR, it may flow higher sense current than the CIP-GMR, enhancing the sensitivity of the MR head device. When the MR head device uses the spin-valve film, irrespective of the CIP and CPP configurations, facilitating control over magnetic domain and reduction of hysteresis, in comparison with a multilayer GMR film. When the MR head device is the TMR, it has higher rate of change of magnetic resistance than the CIP-GMR, enhancing the sensitivity of the MR head device.

Data is amplified by the preamp 52 based on the electric resistance of the MR head device 50 varying according to a signal magnetic field, and then supplied to the read demodulation part 75 to be demodulated to an original signal. The demodulated signal is sent to the host (not shown) through the HDC 73, controller 71, and interface 72.

Further, the present invention is not limited to these preferred embodiments, and various modifications and variations may be made without departing from the spirit and scope of the present invention. Although the instant embodiment uses a CSS, the present invention is applicable to a ramp or other head loading mechanisms.

Thus, the present invention may maintain stable and quick recording and reproducing by reducing or eliminating torsional vibration of a head, and reconcile a demand for miniaturization and a demand for fast access using a high-density disc.

What is claimed is:

1. A disc unit comprising:
   a head that records information onto and/or reproduces information from a disc;
   a suspension that supports said head and includes a circuit that is electrically connected to the head;
   a trunk flexible printed circuit board, which is connected to the circuit of said suspension and is attached to the side surface of said suspension through an air gap, said trunk flexible printed circuit board transmitting a signal indicative of the information to and from said head;
   a main flexible printed circuit board, connected to said trunk flexible printed circuit board, which comprises a preamp IC that amplifies the signal; and
   a damper that damps oscillation of said trunk flexible printed circuit board, said damper being provided on said trunk flexible printed circuit board opposite to said suspension.

2. A disc unit according to claim 1, wherein said damper comprises:
   a first layer; and
   a second layer, formed on said trunk flexible printed circuit board and connected to said trunk flexible printed circuit board, which elastically transmits the oscillation from said trunk flexible printed circuit board to the first layer.

3. A disc unit according to claim 2, wherein the second layer is made of a viscoelastic material.

4. A disc unit according to claim 2, wherein the second layer is a pressure sensitive adhesive double coated tape.

5. A disc unit according to claim 2, wherein the first layer is made of metal.

6. A disc unit according to claim 2, wherein the first layer is made of polyimide.

7. A disc unit according to claim 1, further comprising a spindle motor that rotates the disc at a speed of 10,000 rpm or higher, wherein the disc has storage capacity of 60 GB or larger.

8. A disc unit according to claim 1, wherein said trunk flexible printed circuit board is connected to the circuit at a first junction, and said main flexible printed circuit board at a second junction, and
   wherein said trunk flexible printed circuit board is fixed to said suspension between the first and second junctions.

* * * * *